(12) United States Patent
Yogendra et al.

(10) Patent No.: US 11,514,962 B2
(45) Date of Patent: Nov. 29, 2022

(54) TWO-BIT MAGNETORESISTIVE RANDOM-ACCESS MEMORY CELL

(71) Applicant: International Business Machines Corporation, Armonk, NY (US)

(72) Inventors: Karthik Yogendra, Albany, NY (US); Eric Raymond Evarts, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/096,064

(22) Filed: Nov. 12, 2020

(65) Prior Publication Data

US 2022/0148635 A1 May 12, 2022

(51) Int. Cl.

| | |
|---|---|
| *G11C 11/00* | (2006.01) |
| *G11C 11/16* | (2006.01) |
| *H01L 43/12* | (2006.01) |
| *H01L 27/22* | (2006.01) |
| *G11C 11/56* | (2006.01) |
| *H01F 10/32* | (2006.01) |
| *H01L 43/10* | (2006.01) |

(52) U.S. Cl.
CPC ........ *G11C 11/161* (2013.01); *G11C 11/1673* (2013.01); *G11C 11/1675* (2013.01); *G11C 11/5607* (2013.01); *H01F 10/329* (2013.01); *H01L 27/228* (2013.01); *H01L 43/12* (2013.01); *H01L 43/10* (2013.01)

(58) Field of Classification Search
CPC .............. G11C 11/161; G11C 11/1673; G11C 11/1675; G11C 11/5607; H04L 43/12

USPC ......................................................... 365/158
See application file for complete search history.

(56) References Cited

U.S. PATENT DOCUMENTS

| | | |
|---|---|---|
| 6,577,529 B1 | 6/2003 | Sharma et al. |
| 7,539,047 B2 | 5/2009 | Katti |
| 8,004,881 B2 | 8/2011 | Zhu et al. |
| 8,630,112 B2 | 1/2014 | Cambou |
| 9,047,964 B2 | 6/2015 | Lee et al. |
| 9,437,272 B1 | 9/2016 | Lu et al. |

(Continued)

FOREIGN PATENT DOCUMENTS

| | | |
|---|---|---|
| CN | 103858169 A | 6/2014 |
| EP | 2515306 A1 | 10/2012 |
| WO | 2020006180 A1 | 1/2020 |

OTHER PUBLICATIONS

Shigaki et al., "A Multi-Level-Cell Spin-Transfer Torque Memory with Series-Stacked Magnetotunnel Junctions," Symposium on VLSI Technology, 2010, pp. 47-48.

(Continued)

*Primary Examiner* — Tha-O H Bui
(74) *Attorney, Agent, or Firm* — Robert J. Shatto

(57) ABSTRACT

Provided is a magnetoresistive random-access memory (MRAM) cell. The MRAM cell comprises a first heavy metal layer and a first magnetic tunnel junctions (MTJ) coupled to the first heavy metal layer. The first MTJ has a first area. The MRAM cell further comprises a second MTJ. The second MTJ is connected in series with the first MTJ, and the second MTJ has a second area that is different than the first area. The second MTJ shared a reference layer with the first MTJ. The MRAM cell further comprises a second heavy metal layer that is coupled to the second MTJ.

22 Claims, 13 Drawing Sheets

(56) References Cited

U.S. PATENT DOCUMENTS

| | | | |
|---|---|---|---|
| 9,985,199 B1 | 5/2018 | Briggs et al. | |
| 2002/0036331 A1 | 3/2002 | Nickel et al. | |
| 2015/0213867 A1 | 7/2015 | Wu et al. | |
| 2019/0334080 A1* | 10/2019 | Ahmed | G11C 11/1659 |
| 2020/0013456 A1* | 1/2020 | Tzoufras | G11C 11/1655 |
| 2020/0135804 A1* | 4/2020 | Luo | G11C 11/1675 |
| 2020/0136016 A1* | 4/2020 | Lin | H01L 43/08 |
| 2021/0098689 A1* | 4/2021 | Watanabe | H01L 27/105 |
| 2021/0193912 A1* | 6/2021 | Gupta | G11C 11/5607 |
| 2021/0257545 A1* | 8/2021 | Yu | H01L 43/12 |
| 2021/0288242 A1* | 9/2021 | Yogendra | H01L 43/08 |

OTHER PUBLICATIONS

Kim et al., "Multilevel Spin-Orbit Torque MRAMs," IEEE Transactions on Electron Devices, vol. 62, No. 2, Feb. 2015, pp. 561-568.
International Search Report and Written Opinion, International Application No. PCT/IB2021/060387, dated Feb. 17, 2022, 8 pgs.

* cited by examiner

TWO-BIT MAGNETORESISTIVE RANDOM-ACCESS MEMORY CELL

BACKGROUND

The present disclosure relates to the electrical, electronic, and computer fields. In particular, the present disclosure relates to two-bit magnetoresistive random-access memory (MRAM) cells having three transistors and methods of manufacturing the same.

MRAM is a type of non-volatile memory used in computers and other electronic devices to store data. Unlike conventional read-access memory (e.g., dynamic read-access memory (DRAM)), which stores data as electric charge or current flows (e.g., using capacitors), MRAM stores the data in magnetic domains using magnetic storage elements. The magnetic storage elements are formed from two ferromagnetic plates, each of which can hold a magnetization, separated by an insulating layer. The plate's magnetization can be changed to match that of an external field to store data.

SUMMARY

Embodiments of the present disclosure include a magnetoresistive random-access memory (MRAM) cell. The MRAM cell comprises a first heavy metal layer and a first magnetic tunnel junctions (MTJ) coupled to the first heavy metal layer. The first MTJ has a first area. The MRAM cell further comprises a second MTJ. The second MTJ is connected in series with the first MTJ, and the second MTJ has a second area that is different than the first area. The second MTJ shared a reference layer with the first MTJ. The MRAM cell further comprises a second heavy metal layer that is coupled to the second MTJ.

Additional embodiments of the present disclosure include a method of forming a two-bit MRAM cell. The method comprises forming a second heavy metal layer. The method further comprises forming an MTJ stack. The MTJ stack comprises a first MTJ having a first area and a second MTJ having a second area that is different than the first area. The second MTJ is formed above the second heavy metal layer. The first and second MTJs share a reference layer. The method further comprises forming a first heavy metal layer above the first MTJ.

Additional embodiments of the present disclosure include a method, system, and computer program product for programming a two-bit MRAM cell. The method comprises receiving a write command to program a first bit in the two-bit MRAM cell. The MRAM cell comprises a first MTJ in series with a second MTJ, wherein: an area of the first MTJ is different than an area of the second MTJ; the first MTJ is coupled to a first heavy metal layer; the first heavy metal layer is connected to a bit line using a first transistor; the first heavy metal layer is connected to a source line using a second transistor; the second MTJ is connected to a second heavy metal layer; the second heavy metal layer is connected to the bit line using a third transistor; and the second heavy metal layer is directly connected to the source line. The method further comprises determining that the first bit is to be stored in a particular MTJ. The particular MTJ is one of the first MTJ or the second MTJ. The method further comprises selectively activating one or more of the first, second, and third transistors to cause current to flow through a heavy metal layer that is associated with the particular MTJ.

Additional embodiments of the present disclosure include a method, system, and computer program product for reading a two-bit MRAM cell. The method comprises receiving a read command to read a two-bit MRAM cell that comprises a first MTJ in series with a second MTJ. The area of the first MTJ is different than the area of the second MTJ. The method further comprises driving a current through the MRAM cell. The method further comprises determining a resistance of the MRAM cell. The method further comprises determining a two-bit value of the MRAM cell based on the determined resistance.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

Figures 1, 2:
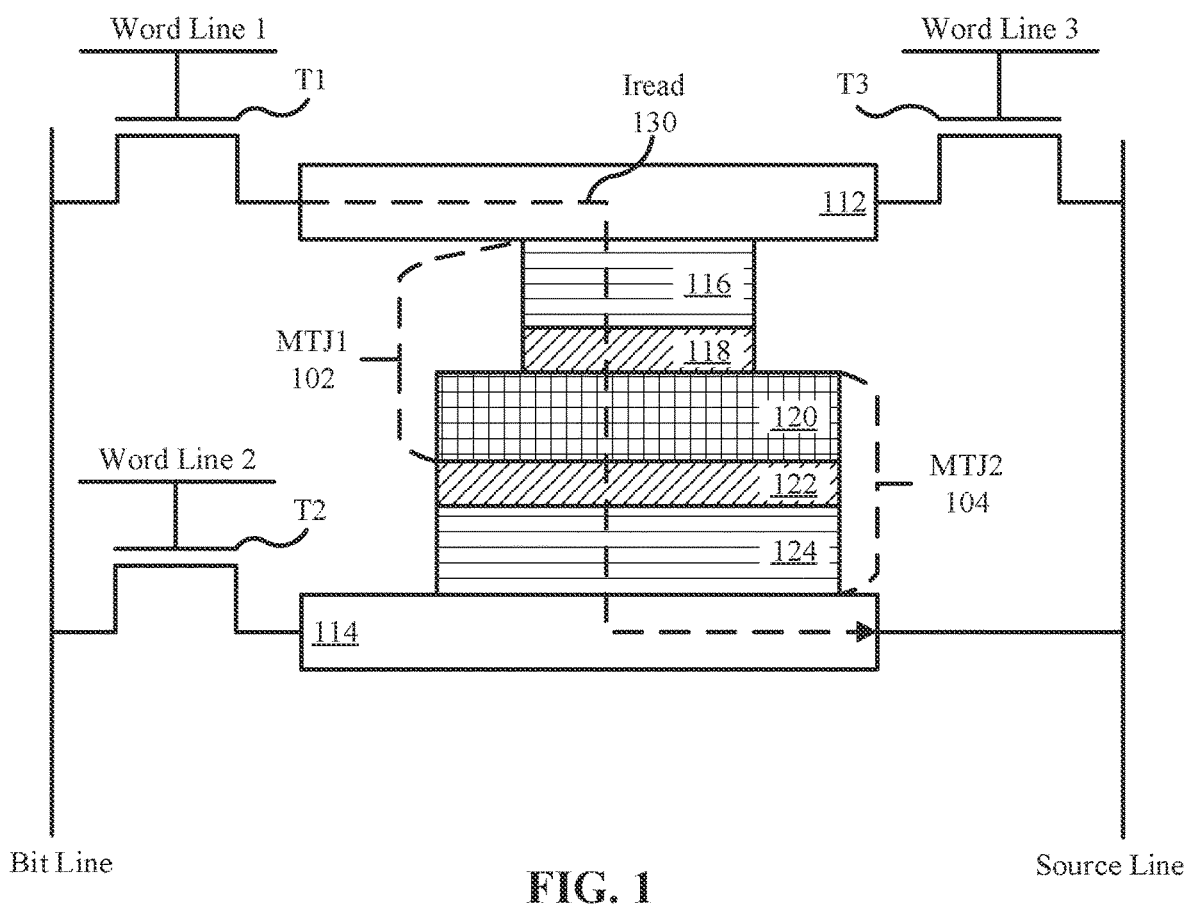
FIG. 1 is a block diagram of an example configuration of a two-bit magnetoresistive random-access memory (MRAM) cell, in accordance with embodiments of the present disclosure.
FIG. 2 depicts an example truth table that illustrates how the states of the two magnetic tunnel junctions (MTJs) of the MRAM cell of FIG. 1 correspond to a bit value state of the MRAM cell, in accordance with embodiments of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the invention.

DETAILED DESCRIPTION

Aspects of the present disclosure relate generally to the electrical, electronic, and computer fields, and in particular to two-bit magnetoresistive random-access memory (MRAM) cells having three transistors and methods of manufacturing the same. While the present disclosure is not necessarily limited to such applications, various aspects of the disclosure may be appreciated through a discussion of various examples using this context.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is in between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and gradually the conductors, insulators and selectively doped regions are built up to form the final device.

Turning now to an overview of technologies that are more specifically relevant to aspects of the present disclosure, in general, a two-bit MRAM cell refers to any material or combination of materials capable of storing two values (e.g., two bits of information) using magnetic storage elements. MRAM cell values, which can be binary ('01' or '00') or analog (e.g., 0.65), are stored in the memory cells as a function of the cell's electrical resistance, similar to how values are stored in resistive random-access memory (Re-RAM or RRAM) cells and/or memristors. In other words, the relative orientation of the magnetization of the plates within the MRAM cell affects the electrical resistance of the MRAM cell. This electrical resistance can be measured by passing a current through the MRAM cell, and the measured electrical resistance can be converted into a value.

Some of the drawbacks with traditional two-terminal MRAM devices include oxide reliability and high write power. Three-terminal spin hall effect (SHE) or spin orbit torque (SOT) MRAM cells overcome these limitations by providing decoupled paths for read and write operations. However, conventional SOT MRAM cells require two transistors coupled to a magnetic tunnel junction (MTJ) to store a single bit of information. This limits the bit density of the MRAM device.

Attempts to increase the low bit density of MRAM devices have focused on creating multi-bit MRAM cells by either (1) employing shared heavy metal with different MTJ pillars and (2) using stacked MTJs with one utilizing the SHE and the other utilizing spin-transfer torque (STT). However, both of these solutions have substantial drawbacks. In the case of different MTJs having a shared heavy metal structure, the MTJs cannot be programmed independently. In the case of stacked MTJs with one MTJ operated by SHE and the other by STT, all the limitations of STT such as tunnel barrier reliability, high write energy, etc. still exist.

Embodiments of the present disclosure may overcome these and other drawbacks of current solutions by using a two-bit SOT MRAM cell that uses three transistors and provides separate write paths for each bit. The two-bit SOT MRAM cell disclosed herein uses two MTJs in a series configuration with a shared reference layer. Two heavy metals (such as Pt, Ta, W etc.) are in contact with two free layers (can be in-plane or perpendicular to plane ferromagnets). The MTJ stack has a shared reference layer with two free layers. The areas of two free layers are different. In this structure, two free layers can be programmed independently using SOT effect by passing current through the heavy metals. The disclosure structure can offer speed improvement (for iso-energy) and energy improvement (for iso-speed) compared to STT-based MRAM cells.

In some embodiments, the two-bit SOT MRAM cell comprises two ferromagnetic free layers (FL1 and FL2) of different areas in contact with two heavy metal (such as Pt, Ta, W, etc.). In some embodiments, the upper free layer has smaller area compared to the lower one. The ferromagnets can have in-plane or perpendicular-to-plane magnetic anisotropy.

A common ferromagnetic reference layer is shared between the two free layers. The reference layer (RL) is separated from each free layer by a tunnel barrier (such as MgO) such that the MTJ stack is formed by FL1/MgO/RL/MgO/FL2. With the two heavy metal layers on either end, the total stack consists of HM1/FL1/MgO/RL/MgO/FL2/HM2 in some embodiments.

The two free layers can be programmed independently by passing 'write' current through two heavy metals, respectively. In other words, by selectively activating one or two of the transistors, current can be allowed to flow through a single heavy metal layer, thereby setting the magnetic orientation of the layers independently based on the current. This allowed each bit to be individually written to the MRAM cell.

The state of the MRM cell is determined by passing 'read' current through the MTJ stack and measuring the associated resistance state of the MTJ stack. Because each MTJ in the stack has a different area/size, its effect on the total resistance of the MTJ stack is different. This allows the MTJ stack to effectively have four resistance states instead of two. As a simplified example, the first MTJ may be programmed to have a resistance of either 10 or 20 kiloohms, and the second MTJ may be programmed to have a resistance of either 1 or 5 kiloohms. Because the MTJs are in series, the entire stack will have a resistance of one of 11, 15, 21, or 25 kiloohms, depending on the magnetic orientation of the two MTJ stacks. Each of these resistance values can be converted into a state for the two-bit MRAM cell. For example, an effective resistance of 11 kiloohms may correspond to a two-bit value of 00. Similarly, 15, 21, and 25 kiloohms may correspond to 01, 10, and 11, respectively.

It is to be understood that while this simplified example is illustrative of the process, in practice the MTJs may not be able to be programmed to exact resistances. As such, each resistance state may have a corresponding range of resistances. Following the example above, and assuming that the MTJ stack can be programmed to within 1.5 kiloohms of the intended value, a two-bit value of 00 may be associated with resistances in the range from [9.5, 12.5] kiloohms. Similarly, the two-bit values 01, 10, and 11 may have corresponding resistance ranges of [13.5, 16.5] kiloohms, [19.5, 22.5] kiloohms, and [23.5, 26.5] kiloohms, respectively.

By decoupling write pathways, the MTJs can be written independently instead of sequentially as is the case with conventional stacked MTJs. This results in a significant time saving when writing to the MRAM cell. Because reading from the MRAM cell involves reading both bits at once, the improvement to the reading speed compared to traditional MRAM cells is not as large as the improvement to the writing speed, but the reading speed may nevertheless be approximately 2 or 3 times faster that traditional MRAM, in some embodiments. Additionally, decoupling the write pathways and using MTJs of different sizes allows more separation between resistance state based on how the tunnel barriers are made.

Additional embodiments of the present disclosure include a method of forming a two-bit SOT MRAM cell. A time controlled IBE or RIE process is used to etch HM1, FL1 and TB1 using a hardmask. HM1, FL1 and TB1, along with a top electrode material, are then encapsulated with a dielectric material. A time controlled IBE or RIE process is used to etch RL, TB2, and FL2. The etching is stopped on the bottom heavy metal. Dielectric material (low-k) is deposited and polished with CMP such that the top surface of HM1 is exposed. Heavy metal (HM1) is deposited on top of patterned HM1 such that it makes contact with the FL1 surface.

As used herein, a "heavy metal," such as those found in the "heavy metal layer," is any metal that has a suitably strong spin-orbit coupling property for inducing a torque on the magnetization of the free layer, thereby causing the free layer to switch magnetic orientations (e.g., from parallel to antiparallel). These metals are also sometimes referred to as Spin Hall metals and spin orbit torque metals.

It is to be understood that the aforementioned advantages are example advantages and should not be construed as limiting. Embodiments of the present disclosure can contain all, some, or none of the aforementioned advantages while remaining within the spirit and scope of the present disclosure.

Turning now to the figures, FIG. 1 a block diagram of an example configuration of a two-bit magnetoresistive random-access memory (MRAM) cell 100, in accordance with embodiments of the present disclosure. The MRAM cell 100 includes two MTJs 102, 104 in an MTJ stack. The first MTJ 102 includes a first free layer (FL1) 116, a first tunnel barrier (TB1) 118, and a reference layer (RL) 120. The second MTJ 104 includes a second free layer (FL2) 124, a second tunnel barrier (TB2) 122, and the RL 120. As shown in FIG. 1, the first and second MTJs 102, 104 share the RL 120.

FL1 116 and FL2 124 are separated from the RL 120 by TB1 118 and TB2 122, respectively. The tunnel barriers act as an insulator between the free layer and the reference layer. TB1 118 and TB2 122 may be made out of any suitable material. For example, in some embodiments, TB1 118 and TB2 122 are layers of epitaxial (crystalline) MgO. In other embodiments, other suitable materials (e.g., amorphous aluminum oxide) may be used as one or both of the tunnel barriers.

As shown in FIG. 1, the first MTJ 102 has a significantly smaller area than the second MTJ 104. Because resistance of an MTJ is proportional to its area, utilizing an MTJ stack with one MTJ that is smaller than the other MTJ ensures that four unique resistive states exist for the MTJ stack.

The first MTJ 102 is coupled to a first heavy metal layer (HM1) 112 through FL1 116. Similarly, the second MTJ 104 is coupled to a second heavy metal layer (HM2) 114 through FL2 124. HM1 112 and HM2 114 may be one or more layers of any metal or alloy exhibits spin orbit torque interactions. For example, HM1 112 and HM2 114 may be one or more of platinum, tungsten, tantalum, and/or manganese. In some embodiments, HM1 112 and HM2 114 are the same material, while in other embodiments HM1 112 and HM2 114 are different metals.

HM1 112 is connected to the bit line and a first word line (word line 1) via a first transistor T1. HM1 112 is also connected to the source line and a third word line (word line 3) via a third transistor T3. Similarly, HM2 114 is connected to the bit line and a second word line (word line 2) via a second transistor T2. HM2 114 is connected to the source line directly (i.e., without an intermediary transistor).

FL1 116 and FL2 124 can be independently programmed to store different values. Each of FL1 116 and FL2 124 must be programmed at a different time to ensure that current does not leak between the two layers (i.e., prevent current from going through the MTJ stack). FL1 is programmed (e.g., written to) by passing current through just HM1 112. This is done by turning on the first and third transistors T1, T3 while keeping the second transistor T2 off. Activating the transistors in this way allows current to flow from the bit line to the source line through HM1 112 without the current going through the stack. The current flowing through HM1 112 sets the magnetic orientation of FL1 116, and therefore can be used to change the resistance of FL1 116.

Similarly, FL2 is programmed (e.g., written to) by passing current through just HM2 114. This is done by turning on the second transistor T2 while the first transistor T1 and the third transistor T3 are off. Activating the transistors in this way allows current to flow from the bit line to the source line through HM2 114 without the current going through the stack. The current flowing through HM2 114 sets the magnetic orientation of FL2 124, and therefore can be used to change the resistance of FL2 124.

The state (i.e., bit values) of the MRAM cell 100 can be read by passing current through the MTJ stack (i.e., through both the first MTJ 102 and the second MTJ 104). This is done by activating the first transistor T1 while the second transistor T2 and the third transistor T3 are off. As shown in FIG. 1, activating the transistors in this way induces a read current (Iread) 130 that flows from the bit line, through the first transistor T1, into HM1 112, through the MTJ stack, into HM2 114, and eventually to the source line. The resistance of the MRAM cell 100 can be determined using the read current 130. The determined resistance can then be converted into a two-bit value (e.g., using a truth table similar to the one shown in FIG. 2).

Referring now to FIG. 2, shown is an example truth table 200 that illustrates how the states of the two MTJs of the MRAM cell of FIG. 1 correspond to a bit value state of the MRAM cell, in accordance with embodiments of the present disclosure. As shown in FIG. 2, each MTJ can be programmed into a parallel state (P) or an anti-parallel state (AP). Each state will have a corresponding resistance value depending on the area of the MTJ. For example, the first MTJ 102 will have a first resistance when in the parallel state and a second resistance when in the anti-parallel state. Similarly, the second MTJ 104 will have a third resistance when in the parallel state and a fourth resistance when in the anti-parallel state.

By controlling the relative sizes of the MTJs, the resistances of each MTJ in both states can be made sufficiently different such that the state of the MTJs can be independently determined from the effective resistance of the stack. This can then be converted into a state for the MRAM cell (i.e., a two-bit value). In the example shown in FIG. 2, a parallel state corresponds to a value of 0 and an antiparallel state corresponds to a bit value of 1. As such, both MTJs being in a parallel state corresponds to a two-bit value of 00, while both MTJs being in the anti-parallel state corresponds to a two-bit value of 11. If the first MTJ 102 is in the parallel state and the second MTJ 104 is in the anti-parallel state, the two-bit value of the MRAM cell is 01. Similarly, if the first MTJ 102 is in the anti-parallel state and the second MTJ 104 is in the parallel state, the two-bit value of the MRAM cell is 10.

Figure 3:
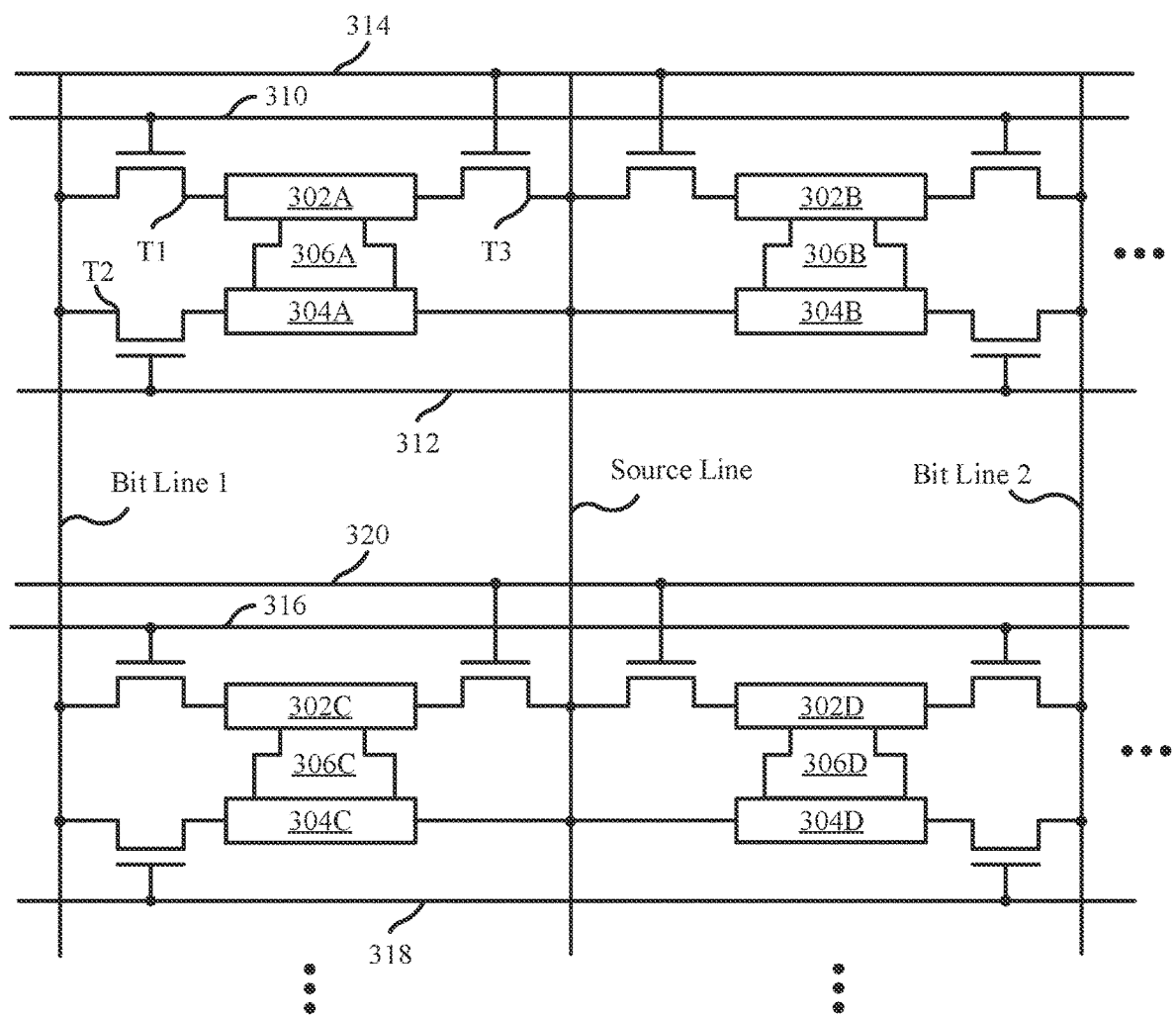
FIG. 3 is a diagram depicting a portion of a MRAM array that is made up of two-bit MRAM cells, in accordance with embodiments of the present disclosure.

Referring now to FIG. 3, shown is a diagram depicting a portion of a MRAM array 300 that is made up of a plurality of two-bit MRAM cells, in accordance with embodiments of the present disclosure. The portion of the MRAM array 300 that is shown in FIG. 3 includes four MRAM cells. The four MRAM cells are connected to six word lines 310-320, two bit lines (bit line 1 and bit line 2) and a source line. Each MRAM cell comprises two heavy metal layers, an MTJ stack, and three transistors.

For example, the first MRAM cell comprises a first heavy metal layer 302A, a second heavy metal layer 304A, and a first MTJ stack 306A. The first heavy metal layer 302A is connected to the first bit line and the first work line 310 through the first transistor T1. The first heavy metal layer 302A is also connected to the source line and a third word line 314 through a third transistor. The first heavy metal layer 302A is connected to the second heavy metal layer 304A through the first MTJ stack 306A. The second heavy metal layer 304A is also connected to the first bit line and the second word line 312 through the second transistor T2.

Similarly, the second MRAM cell comprises two heavy metal layers 302B, 304B, an MTJ stack 306B, and three transistors. Like the first MRAM cell, the second MRAM cell is connected to the first, second, and third word lines 310-314 and the source line. Unlike the first MRAM cell, however, the second MRAM cell is connected to a second bit line (bit line 2). This allows the second MRAM cell to be controlled separately from the first MRAM cell.

The third MRAM cell comprises two heavy metal layers 302C, 304C, an MTJ stack 306C, and three transistors. Like the first MRAM cell, the third MRAM cell is connected to the first bit line (bit line 1) and the source line. Unlike the first MRAM cell, however, the third MRAM cell is connected to a fourth word line 316, a fifth word line 318, and a sixth word line 320. This allows the third MRAM cell to be controlled separately from the first and second MRAM cells.

The fourth MRAM cell comprises two heavy metal layers 302D, 304D, an MTJ stack 306D, and three transistors. Like the second MRAM cell, the third MRAM cell is connected to the second bit line (bit line 2) and the source line. Unlike the second MRAM cell, however, the third MRAM cell is connected to the fourth word line 316, the fifth word line 318, and the sixth word line 320. This allows the fourth MRAM cell to be controlled separately from the first, second, and third MRAM cells.

While only four MRAM cells are shown in FIG. 3, any number of MRAM cells can be included in an MRAM array. In other words, the pattern of MRAM cells shown can be extended for any number of word lines and/or bit lines to accommodate a far larger number of MRAM cells in a single array. The total number of MRAM cells (and the arrangement thereof) may be limited by other aspects of the processor, such as the number of individually addressable elements supported by the processor.

Figure 4:
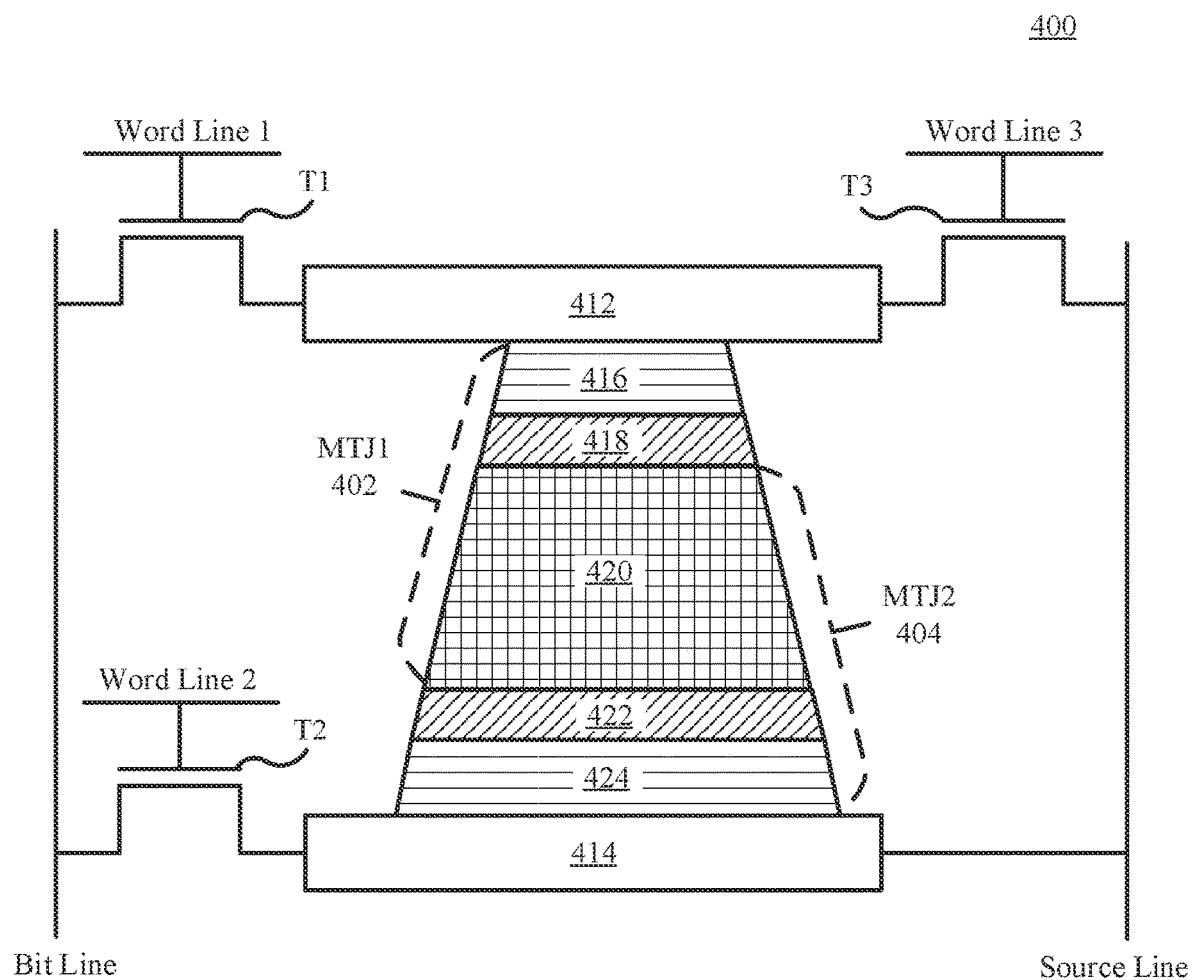
FIG. 4 is a block diagram of a second example configuration of a two-bit MRAM cell, in accordance with embodiments of the present disclosure.

Referring now to FIG. 4, shown is a block diagram of a second example configuration of a two-bit MRAM cell 400, in accordance with embodiments of the present disclosure. The MRAM cell 400 shown in FIG. 4 may be substantially similar to the MRAM cell 100 shown in FIG. 1, except that the shape of the MTJ stack may be different. As such, the first heavy metal layer 412 may be substantially similar to, or the same as, the first heavy metal layer 112 shown in FIG. 1. Similarly, the second heavy metal layer 414 may be substantially similar to, or the same as, the second heavy metal layer 114 shown in FIG. 1.

Like the first MTJ 102 shown in FIG. 1, the first MTJ 402 in FIG. 4 may comprise a first free layer 416, a first tunnel barrier 418, and a reference layer 420. The first free layer 416, the first tunnel barrier 418, and the reference layer 420 may be substantially similar to, or the same as, the first free layer 116, the first tunnel barrier 118, and the reference layer 120 described with respect to FIG. 1, except that the shapes are different. Similarly, the second MTJ 404 may comprise a first second layer 424, a second tunnel barrier 422, and the reference layer 420. The first second layer 424 and the second tunnel barrier 422 may be substantially similar to, or the same as, the second free layer 124 and the second tunnel barrier 122 described with respect to FIG. 1, except that the shapes are different.

Because the first MTJ 402 and the second MTJ 404 have different areas, the MRAM cell 400 will still have four effective resistance states for the same reasons that the MRAM cell 100 has four effective resistance states. Additionally, operation of the MRAM cell 400 is identical to operation of the MRAM cell 100. For example, reading the two-bit value of the MRAM cell 400 can be done by activating the first transistor T1 while the second transistor T2 and third transistor T3 are off. As such, the trapezoidal/pyramid shape of the MTJ stack shown in FIG. 4 may be used as an alternative to the shape of the MTJ stack shown in FIG. 1. This may be due to ease of fabrication, total area of the MTJ stack, or other considerations as recognized by a person of ordinary skill in the art.

It is to be understood that the shapes/configuration shown in FIG. 1 and FIG. 4 are just examples of possible shapes that may be used to create a two-bit MRAM cell. However, numerous other suitable shapes exist, as would be recognized by a person of ordinary skill in the art, and the present disclosure is not to be limited to these example embodiments.

In some embodiments, the heavy metal layers may be local to each cell (as shown in FIG. 4). However, in some other embodiments, the heavy metal layers can be shared among multiple MRAM cells in the same row. These embodiments may have increased complexity, and they require additional write cycles.

Figure 5A:
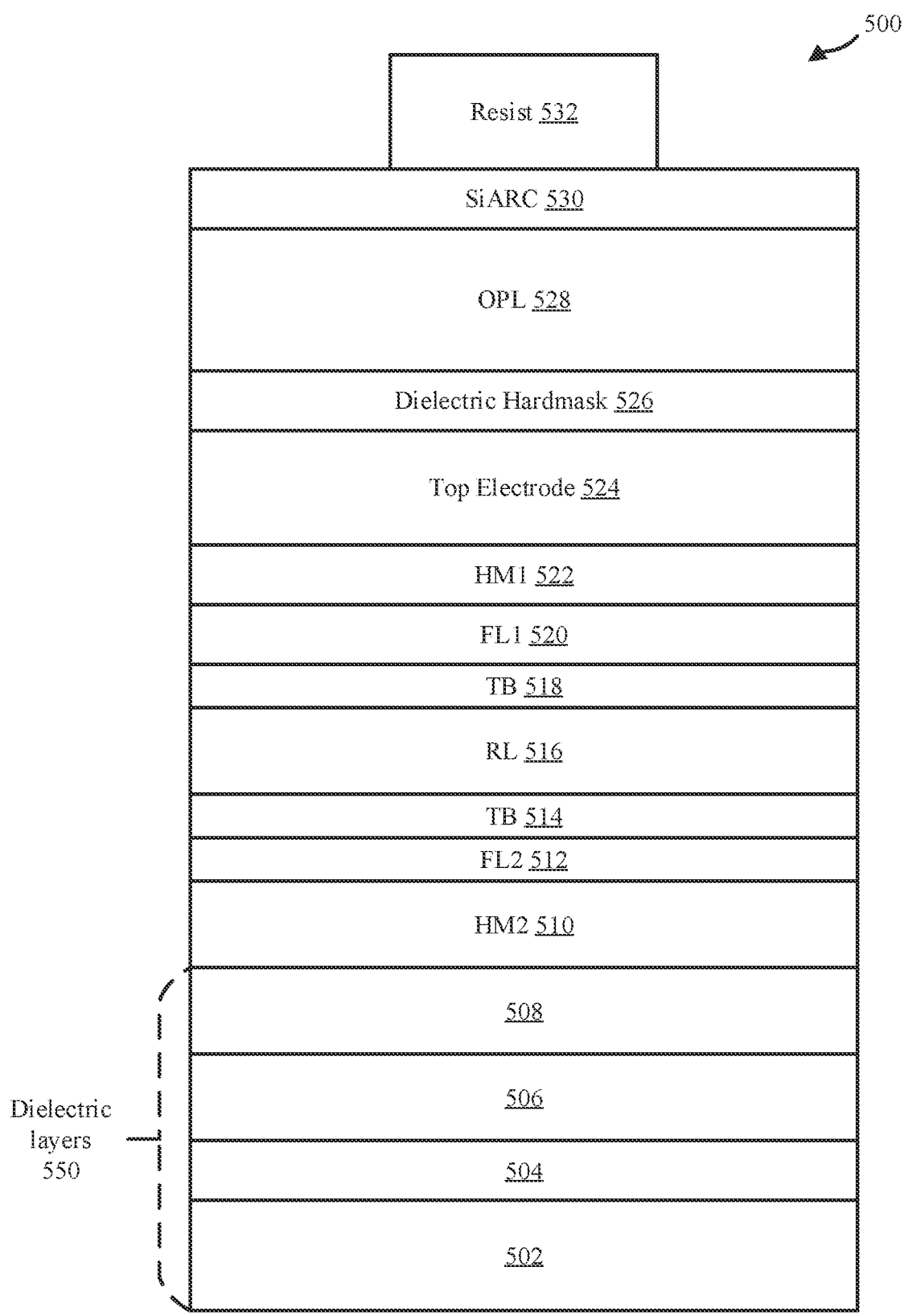
FIG. 5A is a cross-sectional view depicting a two-bit MRAM cell at an intermediate stage of the manufacturing process, in accordance with embodiments of the present disclosure.

Referring now to FIG. 5A, shown is a cross-sectional view depicting a two-bit MRAM cell 500 at an intermediate stage of the manufacturing process, in accordance with embodiments of the present disclosure. FIG. 5A shows the MRAM cell 500 after the initial material stack has been made and prior to the initial etching step. The MRAM cell 500 comprises one or more dielectric layers 504, 506, 508 on a substrate 502. Collectively, these are referred to as the dielectric layers 550.

On top of the dielectric layers 550, there is a heavy metal layer 510 formed using any suitable fabrication process. The heavy metal layer 510 may be formed on the dielectric layers 550 using any suitable fabrication process for depositing a heavy metal (e.g., Pl) on a dielectric layer. A free layer 512 is formed on top of the heavy metal layer 510. The free layer 512 may be any suitable ferromagnetic material.

A tunnel barrier 514 is formed on top of the free layer 512 using any suitable fabrication process. The tunnel barrier 514 may be, for example, MgO. The tunnel barrier 514 may be formed through epitaxial growth or material deposition of MgO on the free layer 512.

A reference layer 516 is formed on top of the tunnel barrier 514 using any suitable fabrication process. A second tunnel barrier layer 518 may be formed on top of the reference layer 516 using any suitable fabrication processor. The second tunnel barrier layer 518 may be substantially similar to, or the same as, the first tunnel barrier layer 514.

A free layer 520 is formed on top of the tunnel barrier 518 using any suitable fabrication process. The free layer 520 may be any suitable ferromagnetic material. In some embodiments, the free layer 520 is the same material as the free layer 512. However, in other embodiments, the two free layers 512, 520 are different materials.

A heavy metal layer 522 is formed on top of the free layer 520 using any suitable fabrication process. The heavy metal layer 522 may be any suitable heavy metal (e.g., any metal that exhibits spin orbit torque properties). The heavy metal layer 522 may be substantially similar to, or the same as, the heavy metal layer 510.

A top electrode 524 is formed on the heavy metal layer 522 using any suitable fabrication process. The top electrode 524 may be made of any suitable electrode material, such as Cu. A dielectric hardmask 526 is formed on top of the top electrode 524. The dielectric hardmask 526 may be any suitable material, as known by a person of ordinary skill in the art. An optical planarization layer (OPL) 528 is formed on top of the dielectric hardmask 526.

A silicon anti-reflective coating (SiARC) 530 is formed on top of the OPL 528. Finally, a resist 532 is formed on top of the SiARC 530.

Figure 5B:
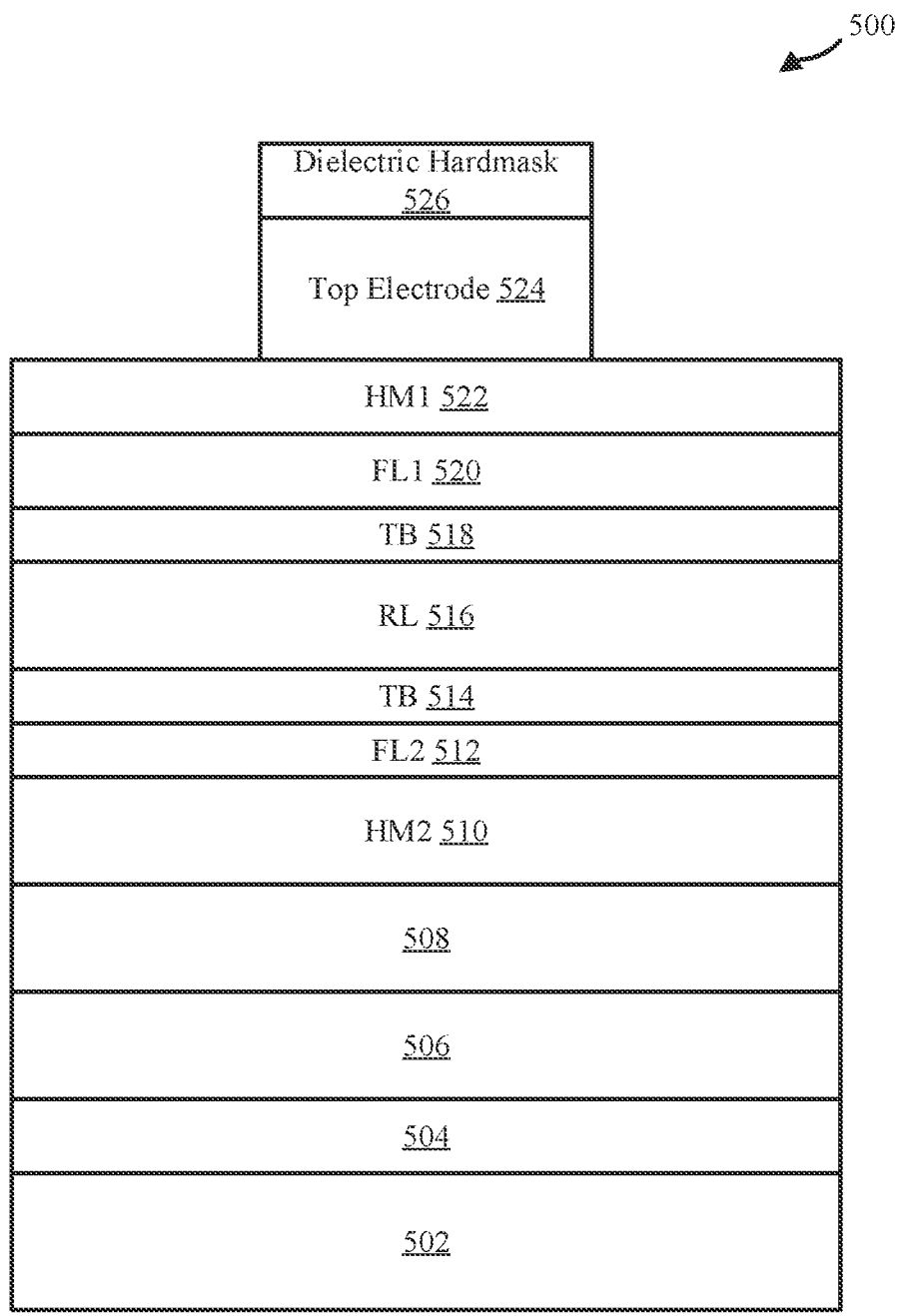
FIG. 5B is a cross-sectional view of a two-bit MRAM cell of FIG. 5A after additional fabrication operations, in accordance with embodiments of the present disclosure.

Referring now to FIG. 5B, a hardmask etching process is performed to remove portions of the dielectric hardmask 526 and the top electrode 524. The hardmask etching process etches down to the top of the heavy metal layer 522. The area of the remaining portion of the dielectric hardmask 526 and top electrode 524 is based on the area of the first MTJ in the MRAM cell 500 at the end of the fabrication process.

Figure 5C:
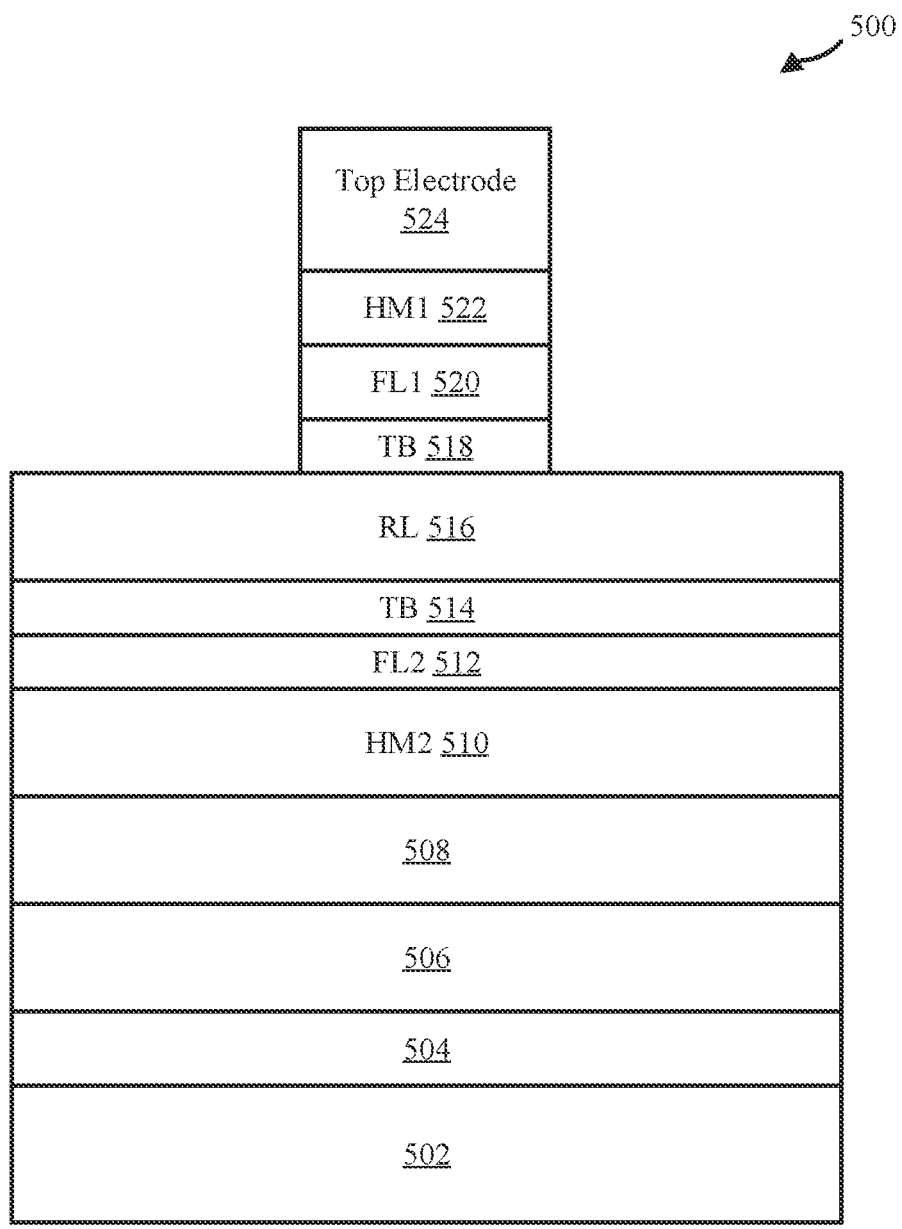
FIG. 5C is a cross-sectional view of a two-bit MRAM cell of FIG. 5B after additional fabrication operations, in accordance with embodiments of the present disclosure.

Referring now to FIG. 5C, a time controlled etch of the heavy metal layer 522, free layer 520, and tunnel barrier 518 is performed. In some embodiments, the time controlled etch utilizes ion beam etching processes. In other embodiments, RIE is performed to etch the heavy metal layer 522, free layer 520, and tunnel barrier 518.

Figure 5D:
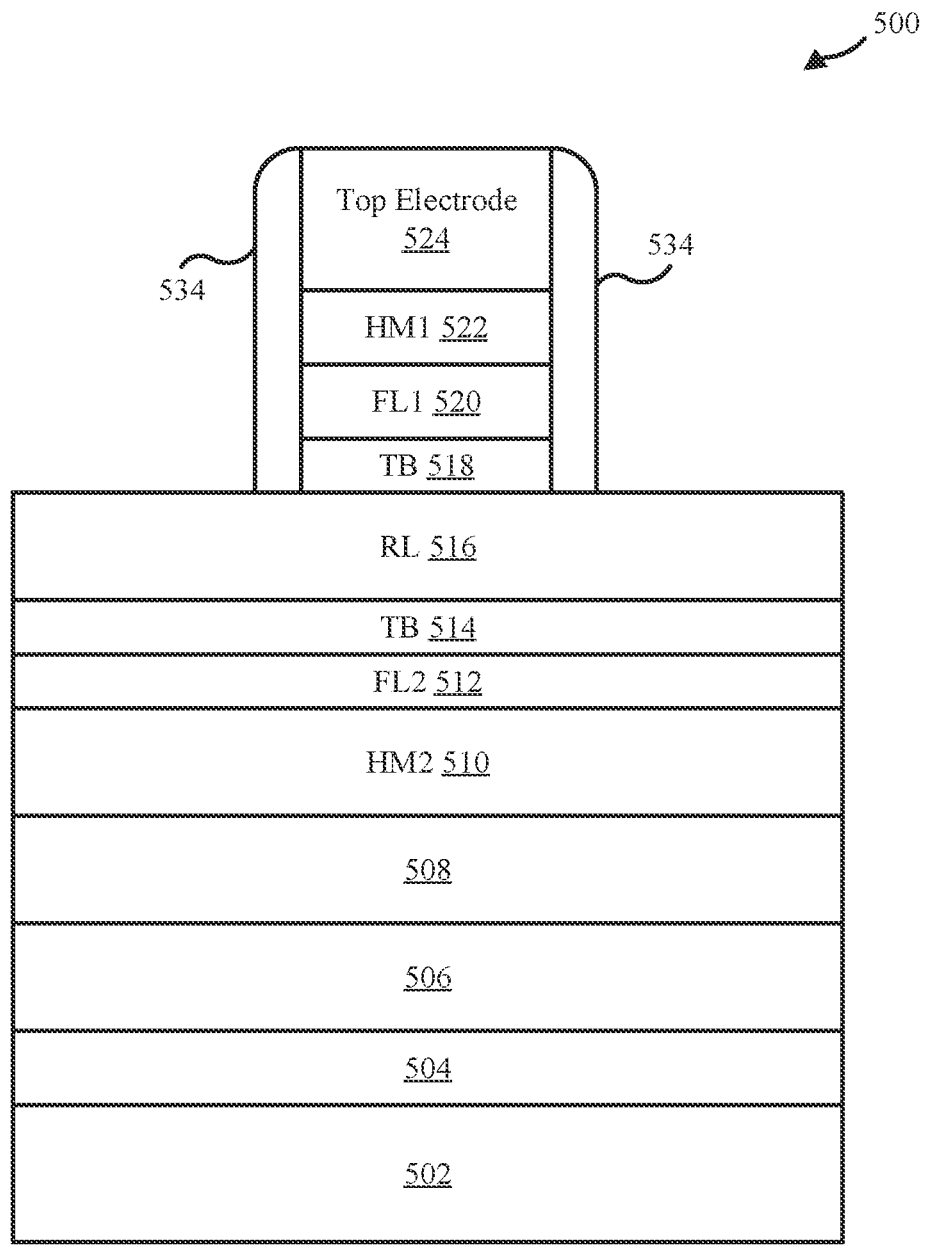
FIG. 5D is a cross-sectional view of a two-bit MRAM cell of FIG. 5C after additional fabrication operations, in accordance with embodiments of the present disclosure.

Referring now to FIG. 5D, dielectric encapsulation of the etched heavy metal layer 522, free layer 520, and tunnel barrier 518 is performed. The dielectric encapsulation includes forming a dielectric (e.g., low-k) material 534 along the lateral edges of the etched heavy metal layer 522, free layer 520, and tunnel barrier 518.

Figure 5E:
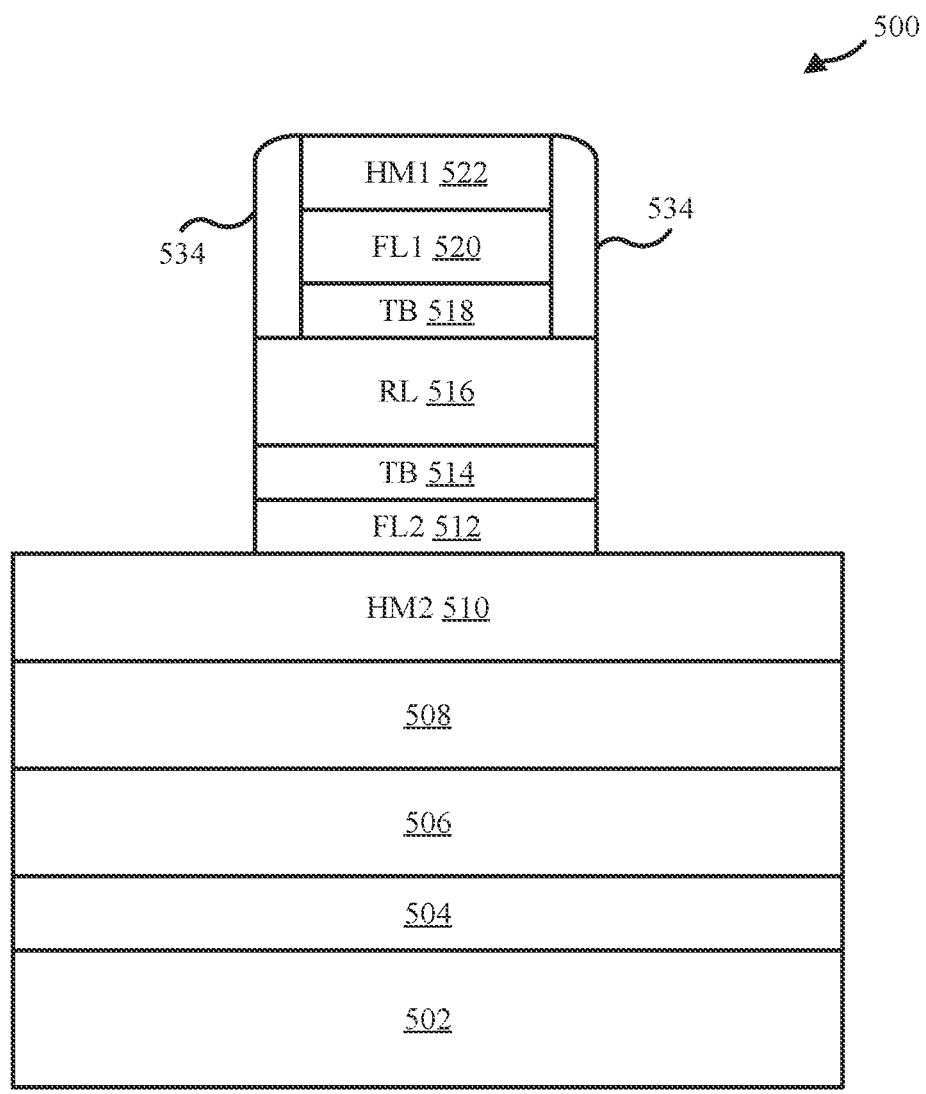
FIG. 5E is a cross-sectional view of a two-bit MRAM cell of FIG. 5D after additional fabrication operations, in accordance with embodiments of the present disclosure.

Referring now to FIG. 5E, the reference layer 516, tunnel barrier 514, and free layer 512 are etched. Time controlled ion beam etching or RIE may be performed to etch the reference layer 516, tunnel barrier 514, and free layer 512. The encapsulated top layers may act as a hardmask for the etching such that the lateral edges of these etched layers are substantially coplanar with the dielectric encapsulation layers 534. The etching may be performed down to the top of the heavy metal layer 510.

Figure 5F:
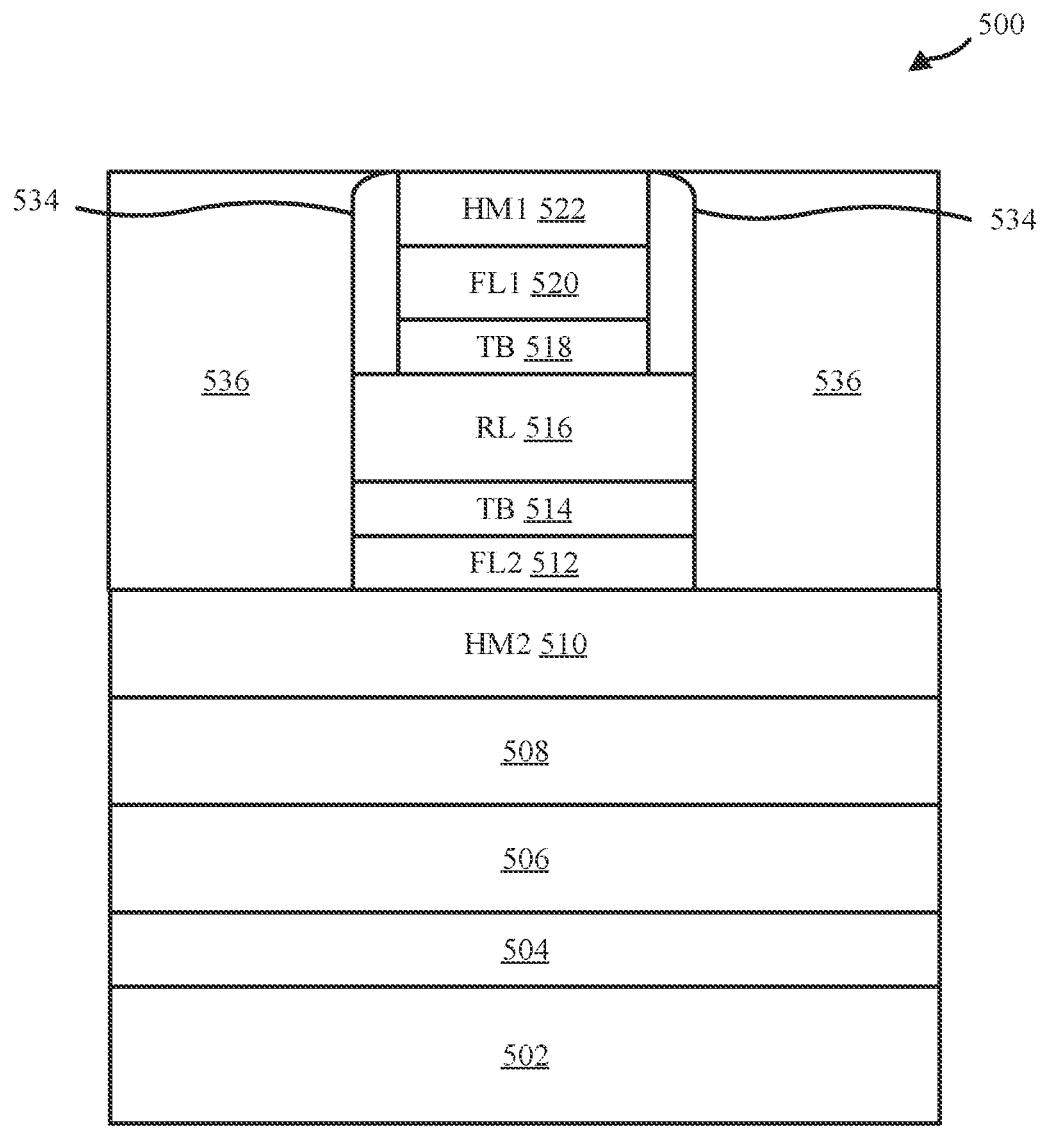
FIG. 5F is a cross-sectional view of a two-bit MRAM cell of FIG. 5E after additional fabrication operations, in accordance with embodiments of the present disclosure.

Referring now to FIG. 5F, dielectric deposition and CMP of any remaining top electrode material to expose the top of the heavy metal layer 522 is performed. The dielectric deposition includes depositing a low-k dielectric material 536 on top of the exposed portions of the heavy metal layer 510. In some embodiments, there can be a second dielectric encapsulation of the whole stack before this step.

Figure 5G:
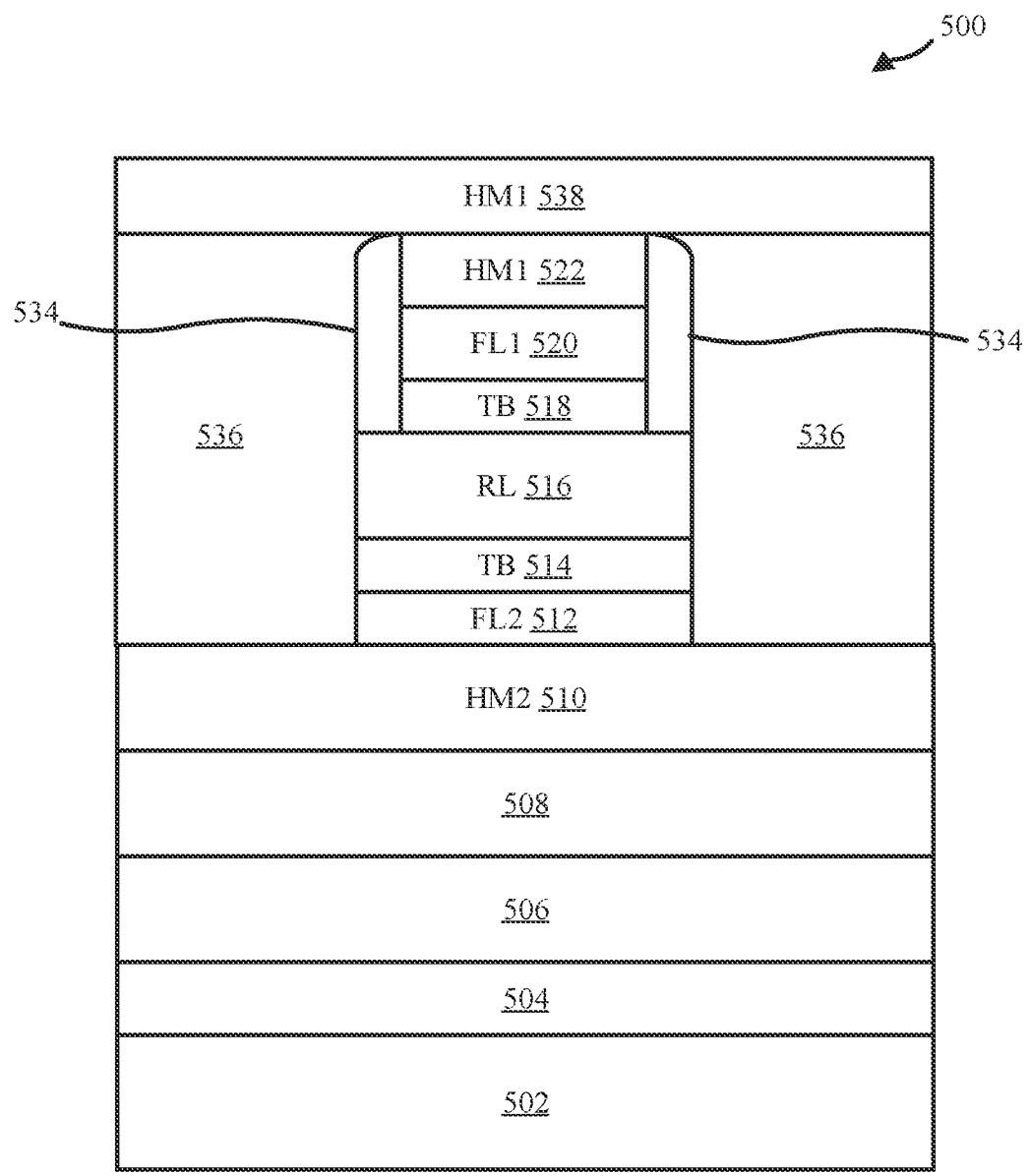
FIG. 5G is a cross-sectional view of a two-bit MRAM cell of FIG. 5F after additional fabrication operations, in accordance with embodiments of the present disclosure.

Referring now to FIG. 5G, a heavy metal layer 538 is deposited on top of the structure such that it is in contact with patterned heavy metal 522, the dielectric encapsulation layer 534, and the deposited low-k dielectric layer 536. In the resulting MRAM cell 500, HM1 522 and HM2 510 can be in two metal layers in back end of line (BEOL) and will be running perpendicular to each other. However, they are shown as parallel in this picture for the sake of illustration.

Figure 6:
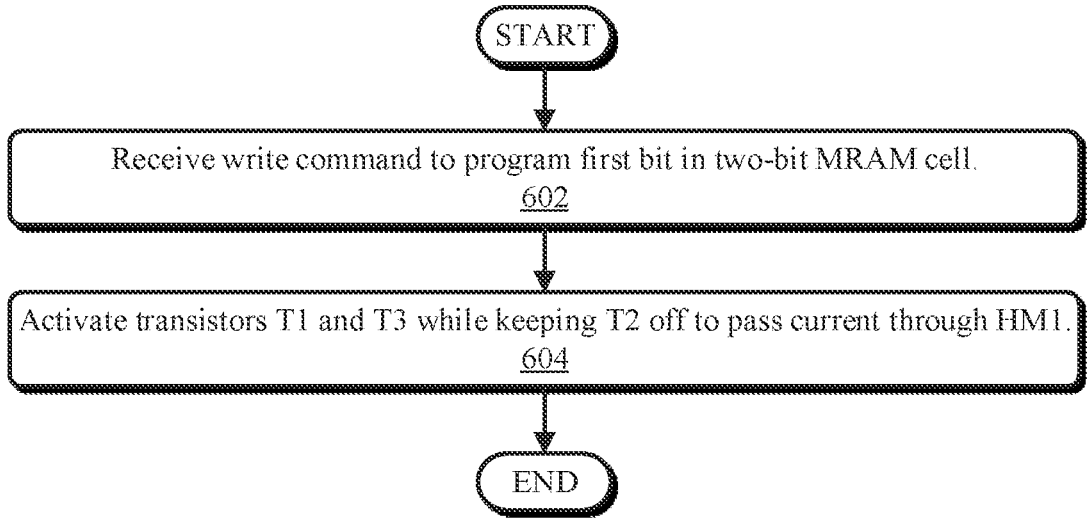
FIG. 6 illustrates a flowchart of an example method for programming a first bit of a two-bit MRAM cell, in accordance with embodiments of the present disclosure.

Referring now to FIG. 6, illustrated is a flowchart of an example method 600 for programming a first bit of a two-bit MRAM cell, in accordance with embodiments of the present disclosure. The method 600 may be performed by hardware, firmware, software executing on a processor, or any combination thereof. For example, the method 600 may be performed by a memory controller (e.g., in a processor). With reference to FIGS. 1, 2, and 6, the method 600 begins at operation 602, wherein the memory controller receives a write command to program a first bit in the two-bit MRAM cell 100.

In the example described in FIG. 6, the first bit is stored in the first MTJ 102. The write command also indicates a value for the first bit (e.g., 0 or 1). In response to receiving the write command, the memory controller determines an associated current necessary to program the value into the first MTJ 102. The associated current depends on whether the first MTJ 102 is to be set in the parallel state (e.g., associated with a 0 in the example shown in FIG. 2) or the anti-parallel state (e.g., associated with a 1 in the example shown in FIG. 2). A voltage is driven into the bit line based on the current necessary to program the proper state into the first MTJ 102. The voltage may be a high voltage or a low voltage.

After charging the bit line to the proper voltage, the first transistor T1 and the third transistor T3 are activated at operation 604. This is done by driving the voltage on the first word line and the third word line high. The second transistor T2 is kept off. This causes current to flow through the first heavy metal layer 112, thereby programming the first MTJ 102 to store the value included in the write command. After programming the first MTJ 102 of the MRAM cell 100 based on the write command, the method 600 ends.

Figure 7:
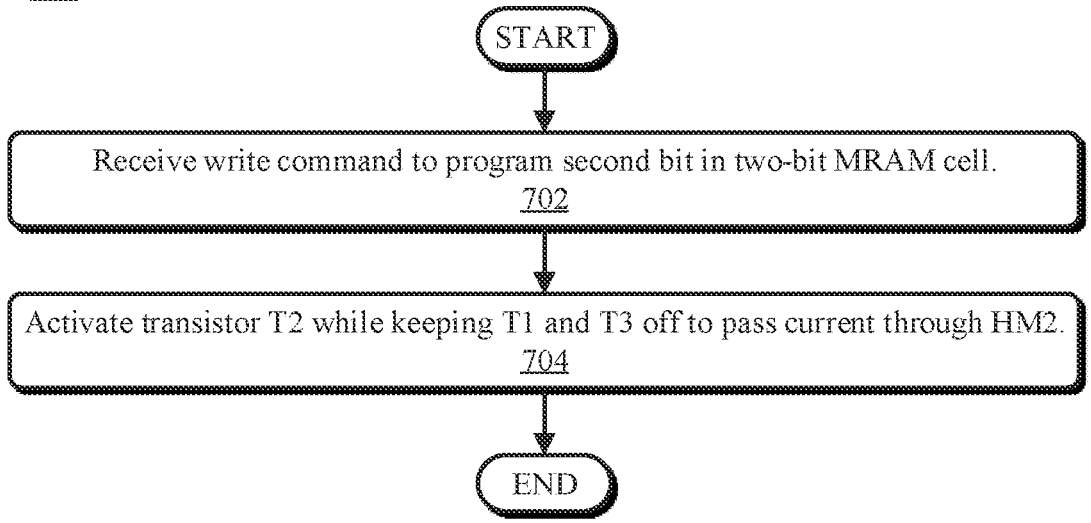
FIG. 7 illustrates a flowchart of an example method for programming a second bit of a two-bit MRAM cell, in accordance with embodiments of the present disclosure.

Referring now to FIG. 7, illustrated is a flowchart of an example method 700 for programming a second bit of a two-bit MRAM cell, in accordance with embodiments of the present disclosure. The method 700 may be performed by hardware, firmware, software executing on a processor, or any combination thereof. For example, the method 700 may be performed by a memory controller (e.g., in a processor). With reference to FIGS. 1, 2, and 7, the method 700 begins at operation 702, wherein the memory controller receives a write command to program a second bit in the two-bit MRAM cell 100.

In the example described in FIG. 7, the second bit is stored in the second MTJ 104. The write command also indicates a value for the second bit (e.g., 0 or 1). In response to receiving the write command, the memory controller determines an associated current necessary to program the value into the second MTJ 104. The associated current depends on whether the second MTJ 104 is to be set in the parallel state (e.g., associated with a 0 in the example shown in FIG. 2) or the anti-parallel state (e.g., associated with a 1 in the example shown in FIG. 2). A voltage is driven into the bit line based on the current necessary to program the proper state into the second MTJ 104. The voltage may be a high voltage or a low voltage.

After charging the bit line to the proper voltage, the second transistor T2 is activated at operation 704. This is done by driving the voltage on the second word line high. The first transistor T1 and third transistor T3 are kept off. This causes current to flow through the second heavy metal layer 114, thereby programming the second MTJ 104 to store the value included in the write command. After programming the second MTJ 104 of the MRAM cell 100 based on the write command, the method 700 ends.

Figure 8:
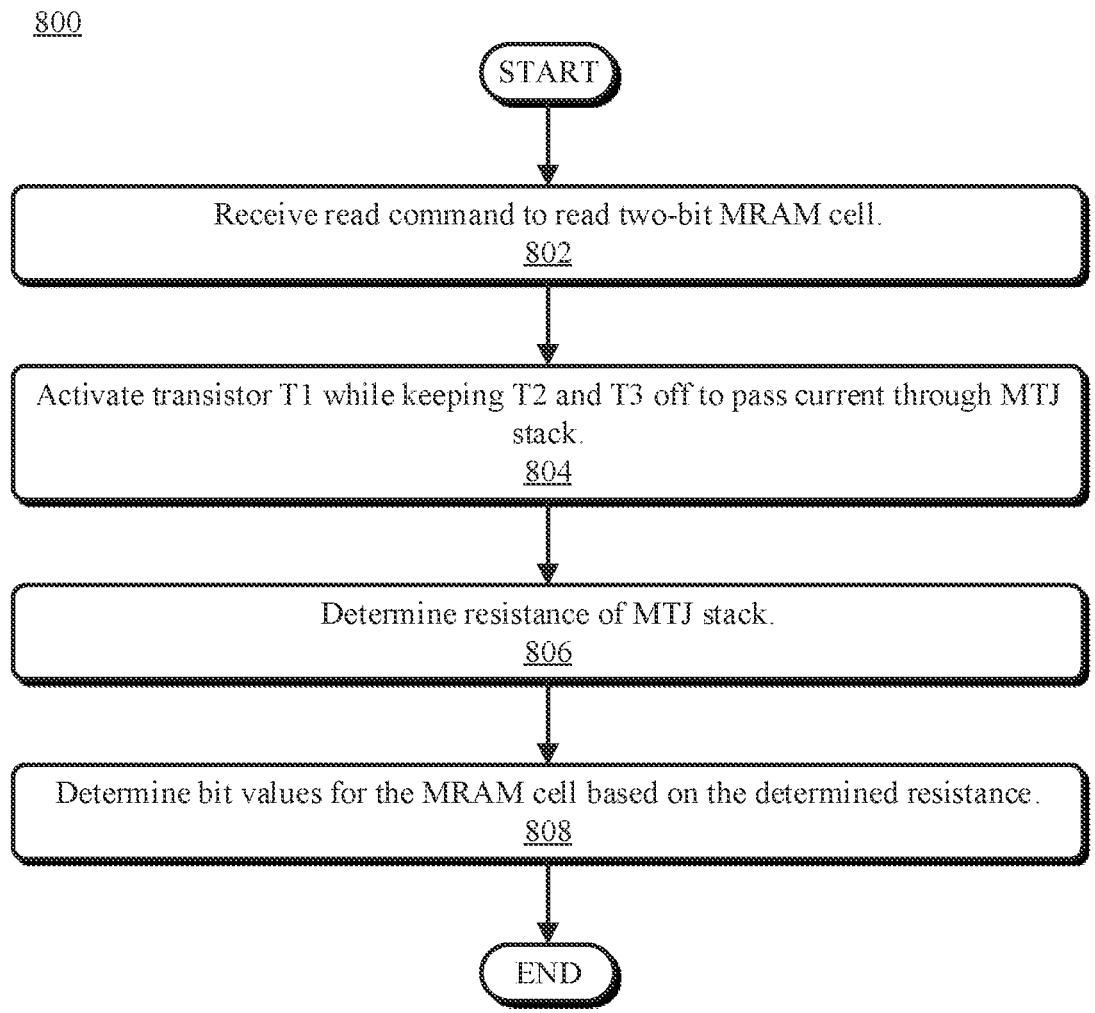
FIG. 8 illustrates a flowchart of an example method for reading data stored in a two-bit MRAM cell, in accordance with embodiments of the present disclosure.

Referring now to FIG. 8, illustrated is a flowchart of an example method 800 for reading data stored in a two-bit MRAM cell, in accordance with embodiments of the present disclosure. The method 800 may be performed by hardware, firmware, software executing on a processor, or any combination thereof. For example, the method 800 may be performed by a memory controller (e.g., in a processor). With reference to FIGS. 1, 2, and 8, the method 800 begins at operation 802, wherein a memory controller receives a read command to read a two-bit MRAM cell 100.

At operation 804, the first transistor T1 is activated. This may be done by driving the voltage of the first word line high. Meanwhile, the second transistor T2 and the third transistor T3 are kept off throughout the read process. Activation of the first transistor T1 (with the other two transistors off) causes a read current to flow through the transistor T1, the first heavy metal layer 112, the MTJs 102, 104, and the second heavy metal layer 114.

At operation 806, the resistance of the MTJ stack is determined. The resistance may be determined using by measuring the read current and applying Ohm's Law to the measured current and using the known pre-charge voltage of the bit line.

At operation 808, the bit values for the MRAM cell are determined based on the calculated resistance of the MTJ stack. Because the first MTJ and the second MTJ have different areas and each MTJ has two resistive states based on whether they are in parallel or anti-parallel orientations, the MRAM cell as a whole effectively has four resistance states. Each of the four resistance states corresponds to a two-bit value (e.g., as shown in FIG. 2). Accordingly, the calculated resistance of the MRAM cell can be compared to the four resistance states to determine the two-bit values of the MRAM cell. After determining the two-bit value of the MRAM cell, the memory controller can return the two-bit value to the originator of the read request, and the method 800 may end.

Figure 9:
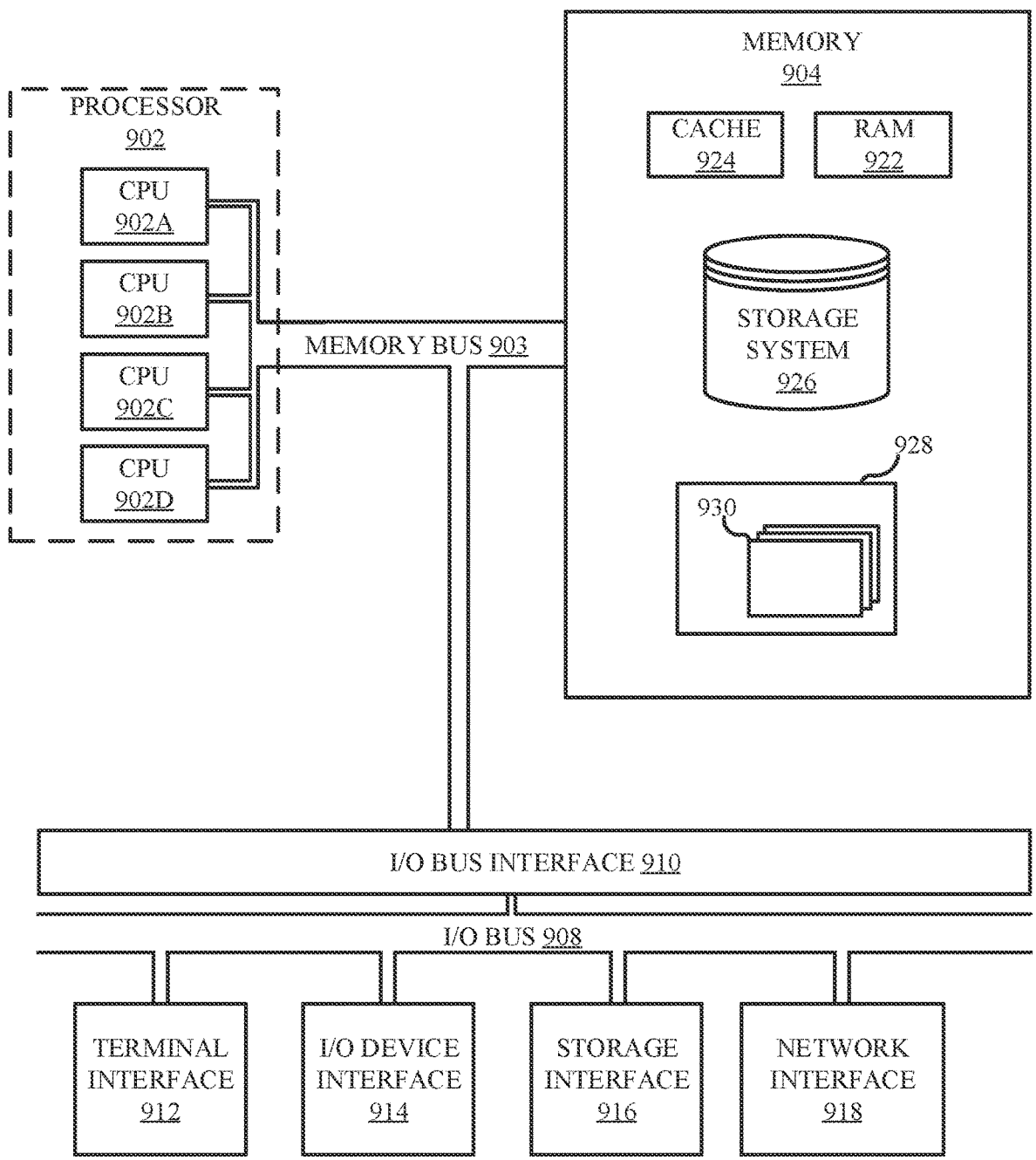
FIG. 9 illustrates a high-level block diagram of an example computer system that may be used in implementing one or more of the methods, tools, and modules, and any related functions, described herein, in accordance with embodiments of the present disclosure.

Referring now to FIG. 9, shown is a high-level block diagram of an example computer system 901 that may be used in implementing one or more of the methods, tools, and modules, and any related functions, described herein (e.g., using one or more processor circuits or computer processors of the computer), in accordance with embodiments of the present disclosure. In some embodiments, the major components of the computer system 901 may comprise one or more CPUs 902, a memory subsystem 904, a terminal interface 912, a storage interface 916, an I/O (Input/Output) device interface 914, and a network interface 918, all of which may be communicatively coupled, directly or indirectly, for inter-component communication via a memory bus 903, an I/O bus 908, and an I/O bus interface unit 910.

The computer system 901 may contain one or more general-purpose programmable central processing units (CPUs) 902A, 902B, 902C, and 902D, herein generically referred to as the CPU 902. In some embodiments, the computer system 901 may contain multiple processors typical of a relatively large system; however, in other embodiments the computer system 901 may alternatively be a single CPU system. Each CPU 902 may execute instructions stored in the memory subsystem 904 and may include one or more levels of on-board cache.

System memory 904 may include computer system readable media in the form of volatile memory, such as random access memory (RAM) 922 or cache memory 924. Computer system 901 may further include other removable/non-removable, volatile/non-volatile computer system storage media. By way of example only, storage system 926 can be provided for reading from and writing to a non-removable, non-volatile magnetic media, such as a "hard drive." Although not shown, a magnetic disk drive for reading from and writing to a removable, non-volatile magnetic disk (e.g., a "floppy disk"), or an optical disk drive for reading from or writing to a removable, non-volatile optical disc such as a CD-ROM, DVD-ROM or other optical media can be provided. In addition, memory 904 can include flash memory, e.g., a flash memory stick drive or a flash drive. Memory devices can be connected to memory bus 903 by one or more data media interfaces. The memory 904 may include at least one program product having a set (e.g., at least one) of program modules that are configured to carry out the functions of various embodiments.

One or more programs/utilities 928, each having at least one set of program modules 930 may be stored in memory 904. The programs/utilities 928 may include a hypervisor (also referred to as a virtual machine monitor), one or more operating systems, one or more application programs, other program modules, and program data. Each of the operating systems, one or more application programs, other program modules, and program data or some combination thereof, may include an implementation of a networking environment. Program modules 930 generally perform the functions or methodologies of various embodiments.

Although the memory bus 903 is shown in FIG. 9 as a single bus structure providing a direct communication path among the CPUs 902, the memory subsystem 904, and the I/O bus interface 910, the memory bus 903 may, in some embodiments, include multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 910 and the I/O bus 908 are shown as single respective units, the computer system 901 may, in some embodiments, contain multiple I/O bus interface units 910, multiple I/O buses 908, or both. Further, while multiple I/O interface units are shown, which separate the I/O bus 908 from various communications paths running to the various I/O devices, in other embodiments some or all of the I/O devices may be connected directly to one or more system I/O buses.

In some embodiments, the computer system 901 may be a multi-user mainframe computer system, a single-user system, or a server computer or similar device that has little or no direct user interface, but receives requests from other computer systems (clients). Further, in some embodiments, the computer system 901 may be implemented as a desktop computer, portable computer, laptop or notebook computer, tablet computer, pocket computer, telephone, smart phone, network switches or routers, or any other appropriate type of electronic device.

It is noted that FIG. 9 is intended to depict the representative major components of an exemplary computer system 901. In some embodiments, however, individual components may have greater or lesser complexity than as represented in FIG. 9, components other than or in addition to those shown in FIG. 9 may be present, and the number, type, and configuration of such components may vary. Furthermore, the modules are listed and described illustratively according to an embodiment and are not meant to indicate necessity of a particular module or exclusivity of other potential modules (or functions/purposes as applied to a specific module).

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

As used herein, "a number of" when used with reference to items, means one or more items. For example, "a number of different types of networks" is one or more different types of networks.

When different reference numbers comprise a common number followed by differing letters (e.g., 100*a*, 100*b*, 100*c*) or punctuation followed by differing numbers (e.g., 100-1, 100-2, or 100.1, 100.2), use of the reference character only without the letter or following numbers (e.g., 100) may refer to the group of elements as a whole, any subset of the group, or an example specimen of the group.

Further, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications, alterations, and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s). Additionally, it is intended that the following claim(s) be interpreted as covering all such alterations and modifications as fall within the true spirit and scope of the invention.

What is claimed is:

1. A two-bit spin orbit torque (SOT) magnetoresistive random-access memory (MRAM) cell, the MRAM cell comprising:
  a first heavy metal layer;
  a first magnetic tunnel junction (MTJ) coupled to the first heavy metal layer, wherein the first MTJ has a first cross-sectional area;
  a second MTJ connected in series with the first MTJ, wherein the second MTJ has a second cross-sectional area that is different than the first cross-sectional area, wherein the second MTJ shares a reference layer with the first MTJ; and
  a second heavy metal layer coupled to the second MTJ, wherein:
  the first heavy metal layer is connected to a first word line and to a bit line through a first transistor;
  the second heavy metal layer is connected to a second word line and to the bit line through a second transistor;
  the first heavy metal layer is connected to a third word line and to a source line through a third transistor; and
  the second heavy metal layer is connected directly to the source line.

2. The MRAM cell of claim 1, wherein the first MTJ comprises:
  a first free layer in direct contact with the first heavy metal layer;
  the reference layer; and
  a first tunnel barrier disposed between the first free layer and the reference layer.

3. The MRAM cell of claim 2, wherein the second MTJ comprises:
  a second free layer in direct contact with the second heavy metal layer;
  the reference layer; and
  a second tunnel barrier disposed between the second free layer and the reference layer.

4. The MRAM cell of claim 2, wherein the first tunnel barrier is a layer of MgO.

5. The MRAM cell of claim 1, wherein the first cross-sectional area is smaller than the second cross-sectional area.

6. The MRAM cell of claim 5, wherein the first MTJ and the second MTJ have different cross-sectional areas, and wherein the shared reference layer has the same cross-sectional area as the second MTJ.

7. The MRAM cell of claim 1, wherein the first heavy metal layer and the second heavy metal layer comprise one or more layers of a metal that exhibits spin orbit torque properties.

8. The MRAM cell of claim 1, wherein the first heavy metal layer and the second heavy metal layer comprise one or more layers of metals selected from the group consisting of platinum, tungsten, tantalum, and manganese.

9. The MRAM cell of claim 1, wherein the first MTJ is stacked on top of the second MTJ.

10. The MRAM cell of claim 1, wherein the MRAM cell is part of a memory array that comprising a plurality of two-bit MRAM cells.

11. The MRAM cell of claim 1, wherein:
  each of the first and second heavy metal layers comprises one or more metals selected from the group consisting of Pt, Ta, Mn, and W; and
  the shared reference layer comprises a ferromagnetic metal.

12. A method of forming a two-bit spin orbit torque (SOT) MRAM cell, the method comprising:
  forming a second heavy metal layer;
  forming a magnetic tunnel junction (MTJ) stack that comprises:
  a second MTJ above the second heavy metal layer, the second MTJ having a second cross-sectional area; and a first MTJ in series with the second MTJ, the first MTJ having a first cross-sectional area, wherein the first cross-sectional area is different than the second cross-sectional area, and wherein the first MTJ shares a reference layer with the second MTJ; and forming a first heavy metal layer above the first MTJ, wherein:

the first heavy metal layer is connected to a first word line and to a bit line through a first transistor;

the second heavy metal layer is connected to a second word line and to the bit line through a second transistor;

the first heavy metal layer is connected to a third word line and to a source line through a third transistor; and the second heavy metal layer is connected directly to the source line.

13. The method of claim 12, wherein forming the MTJ stack comprises:

forming an initial material stack, wherein the initial material stack comprises:
  a second free layer;
  a second tunnel barrier disposed on top of the second free layer;
  the reference layer disposed on top of the second tunnel barrier;
  a first tunnel barrier disposed on top of the reference layer; and
  a first free layer disposed on top of the first tunnel barrier;

etching portions of the first heavy metal layer, the first free layer, and the first tunnel barrier to a first width;

encapsulating the etched first heavy metal layer, the first free layer, and the first tunnel barrier using a dielectric material; and etching the reference layer, the second tunnel barrier, and the second free layer using the encapsulated layers as a hardmask such that a cross-sectional area of the second tunnel barrier and the second free layer is larger than a cross-sectional area of the first tunnel barrier and the first free layer.

14. The method of claim 12, wherein the first cross-sectional area is smaller than the second cross-sectional area.

15. The method of claim 12, wherein the first heavy metal layer and the second heavy metal layer comprise one or more layers of a metal that exhibits spin orbit torque properties.

16. The method of claim 12, wherein the first heavy metal layer and the second heavy metal layer comprise one or more layers of metals selected from the group consisting of platinum, tungsten, tantalum, and manganese.

17. A method of programming a two-bit MRAM cell, the method comprising:

receiving a write command to program a first bit in a two-bit MRAM cell that comprises a first magnetic tunnel junction (MTJ) in series with a second MTJ, wherein:
  an area of the first MTJ is different than an area of the second MTJ;
  the first MTJ is coupled to a first heavy metal layer;
  the first heavy metal layer is connected to a bit line using a first transistor;
  the first heavy metal layer is connected to a source line using a second transistor;
  the second MTJ is connected to a second heavy metal layer;
  the second heavy metal layer is connected to the bit line using a third transistor; and
  the second heavy metal layer is directly connected to the source line;

determining that the first bit is to be stored in a particular MTJ, wherein the particular MTJ is one of the first MTJ or the second MTJ; and selectively activating one or more of the first, second, and third transistors to cause current to flow through a heavy metal layer that is associated with the particular MTJ.

18. The method of claim 17, wherein the particular MTJ is the first MTJ, and wherein selectively activating one or more of the first, second, and third transistors comprises:

activating the first and third transistors to cause current to flow through the first heavy metal layer, wherein the second transistor is not activated.

19. The method of claim 17, wherein the particular MTJ is the second MTJ, and wherein selectively activating one or more of the first, second, and third transistors comprises:

activating the second transistor to cause current to flow through the second heavy metal layer, wherein the first and third transistors remain not activated.

20. A system for programming a two-bit MRAM cell, wherein the system comprises:

an MRAM cell comprising a first magnetic tunnel junction (MTJ) in series with a second MTJ, wherein:
  an area of the first MTJ is different than an area of the second MTJ;
  the first MTJ is coupled to a first heavy metal layer;
  the first heavy metal layer is connected to a bit line using a first transistor;
  the first heavy metal layer is connected to a source line using a second transistor;
  the second MTJ is connected to a second heavy metal layer;
  the second heavy metal layer is connected to the bit line using a third transistor; and
  the second heavy metal layer is directly connected to the source line; and a processor configured to perform a method comprising:

receiving a write command to program a first bit in the MRAM cell;

determining that the first bit is to be stored in a particular MTJ, wherein the particular MTJ is one of the first MTJ or the second MTJ; and selectively activating one or more of the first, second, and third transistors to cause current to flow through a heavy metal layer that is associated with the particular MTJ.

21. The system of claim 20, wherein the particular MTJ is the first MTJ, and wherein selectively activating one or more of the first, second, and third transistors comprises:

activating the first and third transistors to cause current to flow through the first heavy metal layer, wherein the second transistor is not activated.

22. The system of claim 20, wherein the particular MTJ is the second MTJ, and wherein selectively activating one or more of the first, second, and third transistors comprises:

activating the second transistor to cause current to flow through the second heavy metal layer, wherein the first and third transistors remain not activated.

* * * * *